(12) United States Patent
Kim et al.

(10) Patent No.: US 11,784,026 B2
(45) Date of Patent: Oct. 10, 2023

(54) SUBSTRATE PROCESSING APPARATUS, MATERIAL LAYER DEPOSITION APPARATUS, AND ATMOSPHERIC PRESSURE CHEMICAL VAPOR DEPOSITION APPARATUS

(71) Applicant: Samsung Electronics Co., Ltd., Suwon-si (KR)

(72) Inventors: Woongsik Kim, Seoul (KR); Nongmoon Hwang, Seoul (KR); Yoonjung Lee, Seoul (KR)

(73) Assignees: Samsung Electronics Co., Ltd.; Seoul National University R&DB Foundation

( * ) Notice: Subject to any disclaimer, the term of this patent is extended or adjusted under 35 U.S.C. 154(b) by 109 days.

(21) Appl. No.: 17/149,206

(22) Filed: Jan. 14, 2021

(65) Prior Publication Data

US 2021/0222300 A1     Jul. 22, 2021

(30) Foreign Application Priority Data

Jan. 21, 2020    (KR) ........................ 10-2020-0007960

(51) Int. Cl.
| | |
|---|---|
| *H01J 37/32* | (2006.01) |
| *C23C 16/503* | (2006.01) |
| *C30B 25/14* | (2006.01) |
| *C30B 25/10* | (2006.01) |
| *C30B 25/12* | (2006.01) |
| *C23C 16/455* | (2006.01) |

(52) U.S. Cl.
CPC ...... *H01J 37/32073* (2013.01); *C23C 16/503* (2013.01); *C30B 25/14* (2013.01);
(Continued)

(58) Field of Classification Search
CPC . H01J 37/32082–3211; H01J 37/32422; H01J 37/32431–32449; H01J 37/32532; H01J 37/32541; H01J 37/3255; H01J 37/32568; H01J 37/32577; H01J 37/32816–32825; H01J 37/32073; H01J 37/32357; C23C 16/4488; C23C 16/45504; C23C 16/45561; C23C 16/45563;
(Continued)

(56) References Cited

U.S. PATENT DOCUMENTS

| | | | |
|---|---|---|---|
| 4,512,868 A * | 4/1985 | Fujimura | ............ H01L 21/3065 438/727 |
| 4,909,914 A * | 3/1990 | Chiba | ..................... C23C 14/22 239/81 |

(Continued)

FOREIGN PATENT DOCUMENTS

| | | | |
|---|---|---|---|
| JP | 08112549 A | * | 5/1996 |
| KR | 100849674 B1 | | 8/2008 |
| KR | 101008490 B1 | | 1/2011 |

*Primary Examiner* — Gordon Baldwin
*Assistant Examiner* — Kurt Sweely
(74) *Attorney, Agent, or Firm* — Myers Bigel, P.A.

(57) ABSTRACT

A substrate processing apparatus includes a reaction chamber including an inlet through which a reaction gas is supplied and an outlet through which residue gas is exhausted; a plurality of ionizers located at a front end of the inlet and configured to ionize the reaction gas supplied through the inlet; and a heater configured to heat the reaction chamber. The plurality of ionizers include a first ionizer configured to ionize the reaction gas positively; and a second ionizer configured to ionize the reaction gas negatively.

18 Claims, 9 Drawing Sheets

(52) U.S. Cl.
CPC .. *H01J 37/32357* (2013.01); *H01J 37/32541* (2013.01); *H01J 37/32825* (2013.01); *C23C 16/45504* (2013.01); *C23C 16/45561* (2013.01); *C30B 25/105* (2013.01); *C30B 25/12* (2013.01); *H01J 37/3244* (2013.01)

(58) Field of Classification Search
CPC ........ C23C 16/45568; C23C 16/45578; C23C 16/45585; C23C 16/45595; C23C 16/4583; C23C 16/503; C30B 25/08; C30B 25/10; C30B 25/105; C30B 25/12; C30B 25/14; C30B 25/16; C30B 25/165
See application file for complete search history.

(56) References Cited

U.S. PATENT DOCUMENTS

| | | | |
|---|---|---|---|
| 5,560,777 A | 10/1996 | Ahn | |
| 6,116,184 A | 9/2000 | Solayappan et al. | |
| 6,461,692 B2 * | 10/2002 | Fujii | C23C 16/409 427/595 |
| 6,576,202 B1 * | 6/2003 | Chiu | H01J 37/32541 422/186.21 |
| 6,627,560 B1 * | 9/2003 | Miyano | C23C 16/482 257/E21.349 |
| 6,646,856 B2 * | 11/2003 | Lee | H01T 19/04 361/232 |
| 6,649,224 B1 | 11/2003 | De Goeje et al. | |
| 3,240,190 A1 | 8/2012 | Chen et al. | |
| 8,851,012 B2 | 10/2014 | Lee | |
| 2003/0184235 A1 * | 10/2003 | Nakamura | H01J 37/32009 315/111.21 |
| 2007/0212486 A1 | 9/2007 | Dinega et al. | |
| 2009/0136652 A1 * | 5/2009 | Washington | C23C 16/45578 118/724 |
| 2014/0227881 A1 * | 8/2014 | Lubomirsky | C23C 16/54 156/345.35 |
| 2018/0347045 A1 * | 12/2018 | Olsen | H01J 37/3244 |

* cited by examiner

SUBSTRATE PROCESSING APPARATUS, MATERIAL LAYER DEPOSITION APPARATUS, AND ATMOSPHERIC PRESSURE CHEMICAL VAPOR DEPOSITION APPARATUS

CROSS-REFERENCE TO RELATED APPLICATION

This application claims the benefit of Korean Patent Application No. 10-2020-0007960, filed on Jan. 21, 2020, in the Korean Intellectual Property Office, the disclosure of which is incorporated herein in its entirety by reference.

BACKGROUND

The inventive concept relates to a substrate processing apparatus, a material layer deposition apparatus, and an atmospheric pressure chemical vapor deposition (AP-CVD) apparatus, and more particularly, to a substrate processing apparatus, a material layer deposition apparatus, and an AP-CVD apparatus capable of rapidly forming a high-quality material layer.

CVD may be useful in the manufacturing of high-quality material layers. Several types of CVD processes are known, and CVD using plasma may need a high-vacuum atmosphere, may be costly, and may likely damage material layers. A method capable of rapidly forming a crystalline layer in a relatively mild atmosphere is needed.

SUMMARY

The inventive concept provides a substrate processing apparatus capable of rapidly forming a high-quality material layer.

The inventive concept provides a material layer deposition apparatus capable of rapidly forming a high-quality material layer.

The inventive concept provides an atmospheric pressure chemical vapor deposition (AP-CVD) apparatus capable of rapidly forming a high-quality material layer.

The inventive concept provides a material layer forming method capable of rapidly forming a high-quality material layer.

According to an aspect of the inventive concept, there is provided a substrate processing apparatus including a reaction chamber including an inlet through which a reaction gas is supplied and an outlet through which residue gas is exhausted; a plurality of ionizers located at a front end of the inlet and configured to ionize the reaction gas supplied through the inlet; and a heater configured to heat the reaction chamber. The plurality of ionizers include a first ionizer configured to ionize the reaction gas positively; and a second ionizer configured to ionize the reaction gas negatively.

According to another aspect of the inventive concept, there is provided a material layer deposition apparatus including a reaction chamber including an inlet through which a deposition gas is supplied and an outlet through which residue gas is exhausted, and wherein the deposition chamber is configured to accomodate a substrate on which a material layer is to be formed; a first ionizer located at a front end of the inlet and configured to positively ionize the deposition gas supplied through the inlet; a second ionizer located at a front end of the inlet and configured to negatively ionize the deposition gas supplied through the inlet; a first power device configured to supply positive direct current power to the first ionizer; and a second power device configured to supply negative direct current power to the second ionizer.

According to another aspect of the inventive concept, there is provided a chemical vapor deposition apparatus including a reaction chamber having an inlet through which a deposition gas is supplied and an outlet through which residue gas is exhausted, and wherein an internal pressure is maintained as an absolute pressure of between about 0.5 atmosphere to about 1.5 atmosphere; a heater configured to heat the reaction chamber; one or more first ionizers located at a front end of the inlet and configured to positively ionize the deposition gas supplied through the inlet; one or more second ionizers located at a front end of the inlet and configured to negatively ionize the deposition gas supplied through the inlet; a first power device configured to supply positive direct current power to the one or more first ionizer; a second power device configured to supply negative direct current power to the one or more second ionizer; and a gas supply system configured to supply a precursor gas and a carrier gas to the first ionizer and the second ionizer. Each of the first ionizer and the second ionizer includes an inlet portion through which a supplied gas enters, a discharge portion that performs discharge to ionize the entered gas, and an outlet portion through which an ionized gas is exhausted. A length of the outlet portion in a direction of gas flow is greater than a length of the inlet portion in the direction of gas flow, and an inner diameter of the outlet portion decreases in a direction away from the discharge portion.

According to another aspect of the inventive concept, there is provided a material layer forming method including carrying a substrate into a reaction chamber; ionizing a portion of a reaction gas to positive ions by using a first ionizer; ionizing another portion of the reaction gas to negative ions by using a second ionizer; supplying the ionized reaction gas into the reaction chamber; and exhausting a residue gas from the reaction chamber.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
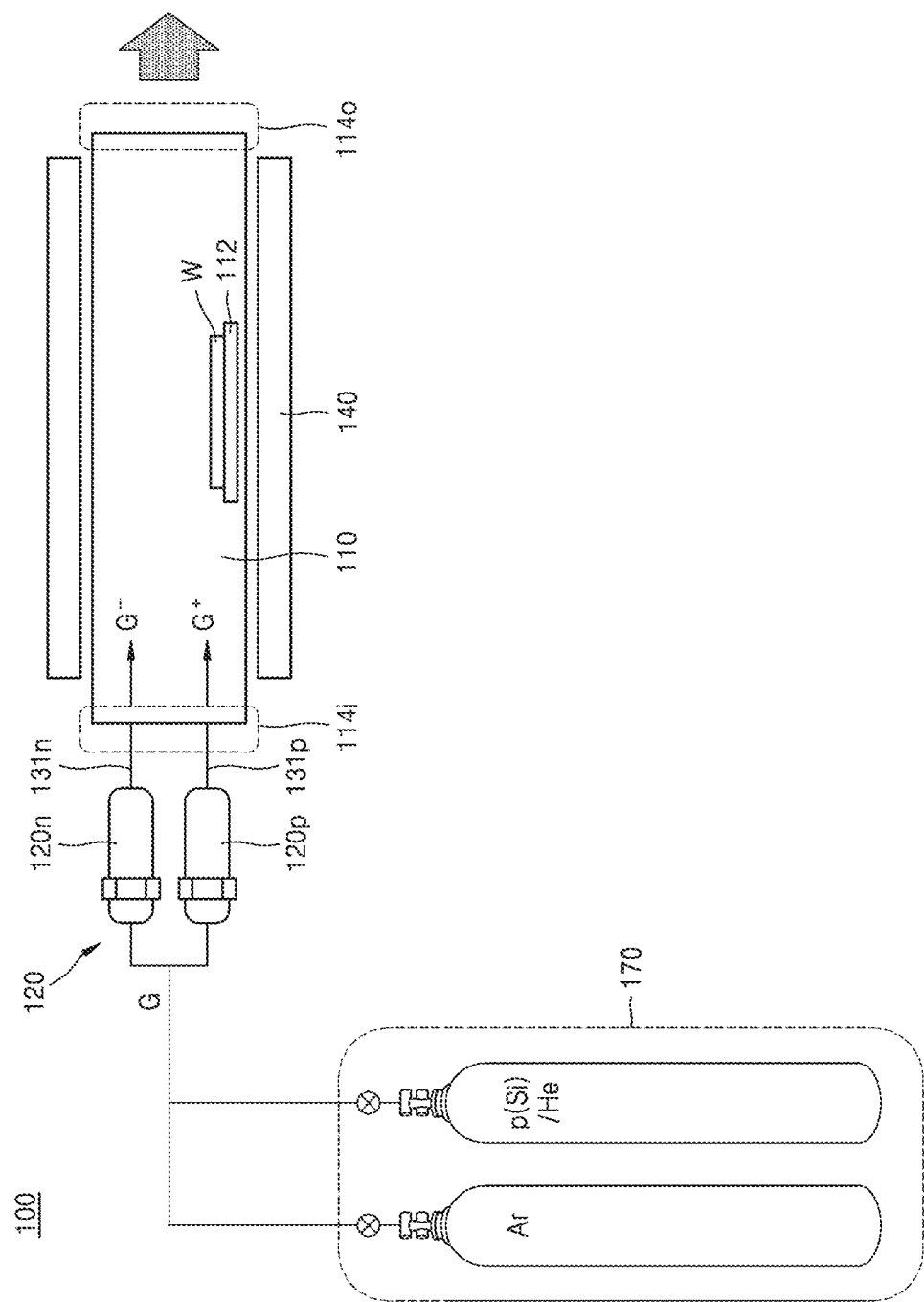
FIG. 1 is a schematic view of a substrate processing apparatus according to an embodiment of the inventive concept.

Embodiments will now be described more fully with reference to the accompanying drawings. In the accompanying drawings, like reference numerals may refer to like elements, and repeated descriptions of the like elements will be omitted.

FIG. 1 is a schematic view of a substrate processing apparatus 100 according to an embodiment of the inventive concept. The substrate processing apparatus 100 may be, but is not limited to, an atmospheric pressure chemical vapor deposition (AP-CVD) apparatus or a low pressure chemical vapor deposition (LP-CVD) apparatus.

Referring to FIG. 1, the substrate processing apparatus 100 includes a reaction chamber 110, a plurality of ionizers 120 attached to a front end of the reaction chamber 110, a heater 140 capable of controlling an internal temperature of the reaction chamber 110, and a gas supply system 170 configured to supply gases necessary for reaction. According to some embodiments, the reaction chamber 110 may be a deposition chamber.

In some embodiments, the reaction chamber 110 defines, for example, a reaction space where a deposition reaction occurs. In some embodiments, a support 112, on which a substrate W may be positioned, may be provided within the reaction chamber 110. In some embodiments, a conveyor belt capable of supporting and moving the substrate W may be provided within the reaction chamber 110. The reaction chamber 110 may have an inlet for carrying the substrate W into the reaction chamber 110, and an outlet for carrying the substrate W out of the reaction chamber 110.

The reaction chamber 110 may be configured to process the substrate W one-by-one, or may be configured to process several substrates at one time. In some embodiments, during substrate processing such as deposition, the substrate W may be stationary at a fixed position or may rotate. According to some embodiments, during deposition, the substrate W may be slowly moved from the inlet to the outlet by the conveyor belt. According to some embodiments, the reaction chamber 110 may be configured such that the substrate W is arranged to be inclined for substrate processing.

The heater 140 capable of controlling the internal temperature of the reaction chamber 110 may be provided on one side of the reaction chamber 110 or around the reaction chamber 110. The heater 140 may be any unit as long as it is able to apply energy to the reaction chamber 110 by using an arbitrary method such as induction heating or resistance heating.

According to some embodiments, the heater 140 may be configured to heat the reaction chamber 110 to have an internal temperature of about 350° C. to about 1000° C. According to some embodiments, the heater 140 may be configured to heat the reaction chamber 110 to have an internal temperature of about 400° C. to about 900° C., about 450° C. to about 800° C., or about 480° C. to about 600° C.

When the internal temperature of the reaction chamber 110 is high, CVD may actively occur without the assistance of ionization and thus merits due to ionization may not be exercised, and much energy may be used and thus the substrate processing apparatus 100 may be uneconomical. On the other hand, when the internal temperature of the reaction chamber 110 is low, activation energy necessary for CVD is insufficient, and thus, deposition speed may be insufficient.

When the substrate processing apparatus 100 is an AP-CVD apparatus, the internal pressure of the reaction chamber 110 may have an absolute pressure of from about 0.5 atm to about 1.5 atm. According to some embodiments, the internal pressure of the reaction chamber 110 may be controlled to be from about 0.6 atm to about 1.4 atm, from about 0.7 atm to about 1.3 atm, from about 0.8 atm to about 1.2 atm, or from about 0.9 atm to about 1.1 atm.

When the internal pressure of the reaction chamber 110 is high, the step coverage of a deposited material layer may become poor. When the internal pressure of the reaction chamber 110 is low, a deposition speed may be low.

When the substrate processing apparatus 100 is an LP-CVD apparatus, the internal pressure of the reaction chamber 110 may have an absolute pressure of about 1 torr to about 500 torr. According to some embodiments, the internal pressure of the reaction chamber 110 may be controlled to be from about 10 torr to about 450 torr, from about 20 torr to about 400 torr, from about 30 torr to about 350 torr, or from about 50 torr to about 300 torr.

The reaction chamber 110 may have an inlet 114i through which a reaction gas is supplied into the reaction space, and an outlet 114o through which a residue gas not reacted within the reaction space is exhausted.

Figure 2:
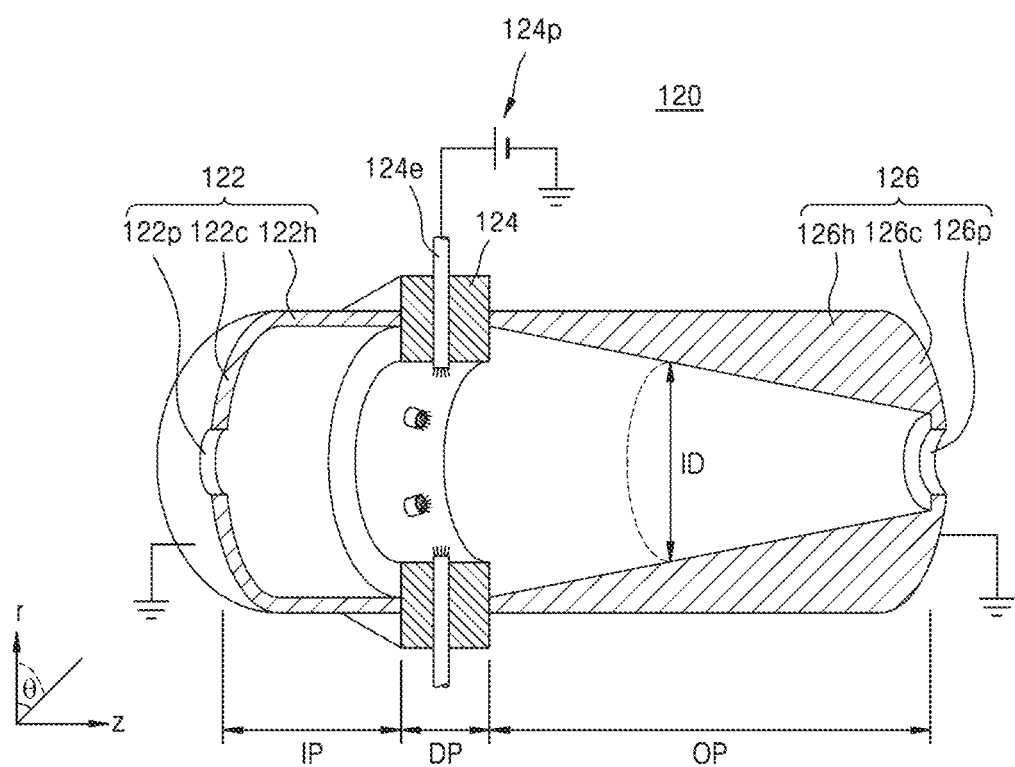
FIG. 2 is a cross-sectional perspective view of an ionizer.

A plurality of ionizers 120 may be connected to the inlet 114i. FIG. 2 is a cross-sectional perspective view of an ionizer 120.

Referring to FIG. 2, the ionizer 120 may include an inlet portion IP, a discharge portion DP, and an outlet portion OP. A gas to be ionized flows into the ionizers 120 via the inlet portion IP and then is ionized at the discharge portion DP, and then flows out of the ionizer 120 through the outlet portion OP.

According to some embodiments, an inlet housing 122 that constitutes the inlet portion IP may include an inlet extension 122h having a cylindrical shape, an inlet port 122p via which an entering gas enters, and an inlet cover 122c that defines an end of an inlet side while forming the inlet port 122p.

According to some embodiments, an outlet housing 126 that constitutes the outlet portion OP may include an outlet extension 126h having a cylindrical shape, an outlet port 126p via which an ionized reaction gas is exhausted, and an outlet cover 126c that defines an end of an outlet side while forming the outlet port 126p.

According to some embodiments, each of the inlet portion IP and the outlet portion OP may be formed of an electrical conductor, and may be grounded.

The discharge portion DP is between the inlet portion IP and the outlet portion OP. The discharge portion DP ionizes a reaction gas that enters through the inlet portion IP and passes the discharge portion DP.

To ionize the reaction gas, the discharge portion DP may include a discharge electrode 124e exposed to the internal space of the ionizer 120, and an electrode support 124 for supporting the discharge electrode 124e.

The electrode support 124 may have an arbitrary shape capable of supporting the discharge electrode 124e, and is not limited to the shape shown in FIG. 2. According to some embodiments, the electrode support 124 may be formed of an electrical nonconductor, for example, polymer (such as, polytetrafluoroethylene (PTFE), silicone, polyvinyl chloride (PVC), polyurethane, polypropylene, high density polyethylene, low density polyethylene, or polyethylene terephthalate) or a ceramic material (such as, silica, alumina, zirconia, or pyrex glass).

The discharge electrode 124e may be any electrical conductor, and is not limited particularly. According to some embodiments, the discharge electrode 124e may be an electrical conductor that receives direct current (DC) power from the outside and has one end exposed to the reaction space. According to some embodiments, the discharge electrode 124e may use a carbon-based material, for example, carbon fibers, carbon nanotubes, carbon nanowires, graphene, or graphite.

According to some embodiments, the discharge electrode 124e may be a bundle of a plurality of carbon fibers. According to some embodiments, the discharge electrode 124e may be a bundle of about 10 to about 3000 carbon fibers. According to some embodiments, carbon fibers may not be bound so as to be randomly separated from each other at one end of the discharge electrode 124e.

Figure 3:
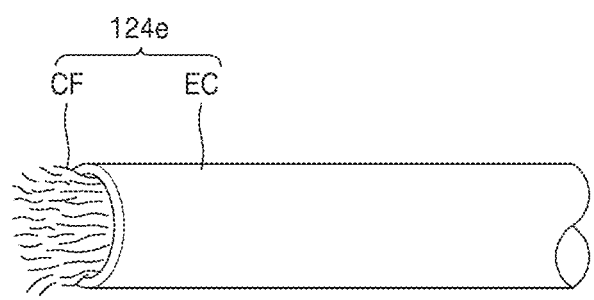
FIG. 3 is a perspective view of an end of a discharge electrode included in the ionizer of FIG. 2.

FIG. 3 is a perspective view of an end of the discharge electrode 124e.

Referring to FIG. 3, the discharge electrode 124e may include a covering portion EC that binds the carbon fibers, and carbon fibers CF of which terminal ends are exposed from the covering portion EC and are spaced apart from each other. As shown in FIG. 3, in the discharge electrode 124e, a plurality of carbon fibers may be bounded by the covering portion EC, and respective ends of the carbon fibers, the respective ends each having a predetermined length, may not be bound and may be randomly spaced apart from each other. The term "randomly" means that the exposed terminal ends of the carbon fibers CF are not aligned with each other and extend a plurality of different respective distances from the covering portion EC.

The covering portion EC may be formed of any coating material having insulating properties, for example, a polymer such as PTFE, silicone, PVC, polyurethane, polypropylene, high density polyethylene, low density polyethylene, or polyethylene terephthalate.

As shown in FIG. 3, because respective ends of the carbon fibers of the discharge electrode 124e are randomly spaced apart from each other, the reaction gas may be more effectively ionized. In other words, when power of a predetermined potential is applied to the discharge electrode 124e, corona discharge may occur at the respective ends thereof, and the reaction gas passing the vicinity of the respective ends may be ionized. A space where a reaction gas may be validly ionized may be increased by separating the respective ends of the carbon fibers.

Referring back to FIG. 2, the discharge portion DP may include a plurality of discharge electrodes 124e, and the plurality of discharge electrodes 124e may be spaced apart from each other with intervals and arranged around the discharge portion DP. According to some embodiments, the plurality of discharge electrodes 124e may be spaced apart from each other at regular intervals around the discharge portion DP. Although one ionizer includes 6 discharge electrodes in FIG. 7, embodiments of the inventive concept are not limited thereto. In some embodiments, one ionizer may include one to five discharge electrodes. According to other embodiments, one ionizer may include more than 6 discharge electrodes, for example, 7 to 32, 8 to 16, or 10 to 14 discharge electrodes.

Referring to FIG. 2, compared with the inlet portion IP, the outlet portion OP may further extend in a direction wherein the reaction gas flows. When the ionizer 120 has a cylindrical shape, the ionizer 120 may be disposed in a cylindrical coordinate system. In particular, a direction in which the ionizer 120 extends may be defined as a z direction, the center of a cylinder may be defined as an origin, and a radius (r) direction and a central angle (θ) may be defined. In the z direction, an extension length of the outlet portion OP may be greater than that of the inlet portion IP.

According to some embodiments, the inner wall of the outlet portion OP may have a conical shape or a shape that is approximately similar to the conical shape. As shown in FIG. 2, the inner wall of the outlet portion OP may have a circular cross-section taken along a line perpendicular to a z axis. The circular cross-section may have an inner diameter ID. The inner diameter ID may decrease in a direction away from the discharge portion DP and in a direction toward the outlet port 126p.

Although the inner diameter ID linearly decreases in a direction away from the discharge portion DP in FIG. 2, embodiments of the inventive concept are not limited thereto. According to some embodiments, the inner wall of the outlet portion OP may be formed more concavely or more convexly than the illustration in FIG. 2.

Referring back to FIG. 1, as described above, a plurality of ionizers 120 may be connected to the inlet 114i.

The plurality of ionizers 120 may include a first ionizer 120p configured to ionize the reaction gas positively, and a second ionizer 120n configured to ionize the reaction gas negatively.

Polarity of ionization by the ionizers 120 may be determined according to a direction in which a current is provided to the discharge electrodes 124e of the ionizers 120.

Referring back to FIG. 2, a cathode of power 124p is connected to the discharge electrode 124e. In this case, the reaction gas that passes the discharge portion DP may be ionized positively. For example, when a silane ($SiH_4$) gas passes the discharge portion DP, the silane gas may be ionized to $SiH_4^+$.

The magnitude of a voltage that is applied to the power 124p may be from about +1 kV to about +15 kV, from about +2 kV to about +12 kV, from about +3 kV to about +10 kV, or from about +4 kV to about +7 kV. When the magnitude of the voltage is excessively large, corona discharge may not occur and arc discharge may occur, and thus, the reaction gas may not be ionized. When the magnitude of the voltage is excessively small, ionization of the reaction gas due to corona discharge may be insufficient.

If an anode of the power 124p is connected to the discharge electrode 124e, the reaction gas that passes the discharge portion DP may be ionized negatively. In other words, if a silane (SiH$_4$) gas passes the discharge portion DP, the silane gas may be ionized to SiH$_4^-$.

If the anode of the power 124p is connected to the discharge electrode 124e, the magnitude of the voltage that is applied to the power 124p may be from about −1 kV to about −15 kV, from about −2 kV to about −12 kV, from about −3 kV to about −10 kV, or from about −4 kV to about −7 kV. When the absolute value of the magnitude of the voltage is excessively large, corona discharge may not occur and arc discharge may occur, and thus, the reaction gas may not be ionized. When the absolute value of the magnitude of the voltage is excessively small, ionization of the reaction gas due to corona discharge may be insufficient.

Referring back to FIG. 1, the first ionizer 120p and the second ionizer 120n may be connected to the inlet 114i of the reaction chamber 110 in parallel. The positively-ionized reaction gas exhausted by the first ionizer 120p may enter the reaction chamber 110 through, for example, a first conductive pipe 131p. The negatively-ionized reaction gas exhausted by the second ionizer 120n may enter the reaction chamber 110 through, for example, a second conductive pipe 131p.

When a gas G passes through the first ionizer 120p, the gas G may be ionized to a gas G$^+$. When the gas G passes through the second ionizer 120n, the gas G may be ionized to a gas G$^-$. When ionized gases (G$^+$ and G$^-$) instead of the gas G are used to form a material layer on the substrate W, a better material layer may be more rapidly formed.

In more detail, when SiH$_4$ gas is used as the reaction gas, bond strength between silicon atoms and hydrogen atoms becomes weaker when the SiH$_4$ gas is ionized. The bond strength between silicon atoms and hydrogen atoms in SiH$_4$ gas is 3.9 eV, whereas the bond strength between silicon atoms and hydrogen atoms in positively-ionized SiH$_4^+$ gas and the bond strength between silicon atoms and hydrogen atoms in negatively-ionized SiH$_4^-$ gas are 0.30 eV and 0.98 eV, respectively.

Similarly, when disilane (Si$_2$H$_6$) gas is used as the reaction gas, the bond strength between silicon atoms and the bond strength between silicon atoms and hydrogen atoms become weaker when the disilane (Si$_2$H$_6$) gas is ionized. The bond strength between silicon atoms in the Si$_2$H$_6$ gas is 3.2 eV, and the bond strength between silicon atoms and hydrogen atoms in the Si$_2$H$_6$ gas is 3.5 eV. The bond strength between silicon atoms in positively-ionized Si$_2$H$_6^+$ gas is 1.6 eV, and the bond strength between silicon atoms and hydrogen atoms in positively-ionized Si$_2$H$_6^+$ gas is 1.59 eV. The bond strength between silicon atoms in negatively-ionized Si$_2$H$_6^-$ gas is 1.11 eV, and the bond strength between silicon atoms and hydrogen atoms in negatively-ionized Si$_2$H$_6^-$ gas is 1.02 eV.

Embodiments of the inventive concept are not limited to a particular theory, but coupling energy weakened due to ionization as described above enables more rapid material layer formation.

The reaction gas may be supplied from the gas supply system 170 to the ionizers. The gas supply system 170 of FIG. 1 forms a reaction gas mixture G by mixing a first supply gas as a mixture of the precursor of silicon p(Si) and helium (He) with a second supply gas, namely, argon (Ar), serving as a carrier, but embodiments of the inventive concept are not limited to this example.

Figure 4:
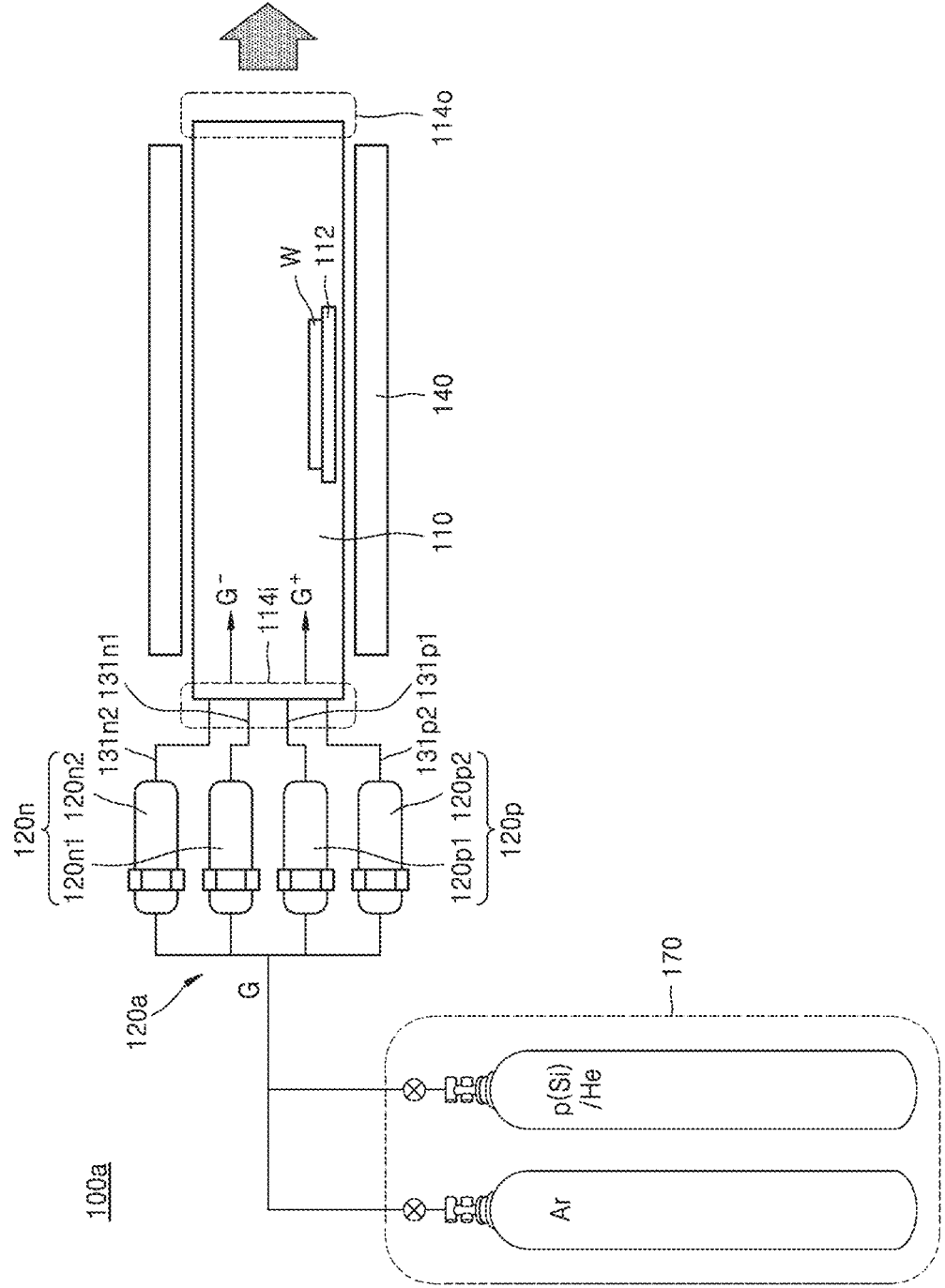
FIG. 4 is a schematic view of a substrate processing apparatus according to another embodiment of the inventive concept.

FIG. 4 is a schematic view of a substrate processing apparatus 100a according to another embodiment of the inventive concept.

The substrate processing apparatus 100a of FIG. 4 is the same as the substrate processing apparatus 100 of FIG. 1 except that more ionizers are provided than the substrate processing apparatus 100 of FIG. 1. Accordingly, this difference will now be focused on and described.

Referring to FIG. 4, two first ionizers 120p1 and 120p2 and two second ionizers 120n1 and 120n2 may be connected to the inlet 114i of the reaction chamber 110 in parallel.

In detail, the reaction gas mixture G that is supplied by the gas supply system 170 enters each of the four ionizers, namely, the first ionizers 120p1 and 120p2, and the second ionizers 120n1 and 120n2. The reaction gas mixture G that has entered the two first ionizers 120p1 and 120p2 turns into a positively-ionized reaction gas mixture G$^+$ and enters the reaction chamber 110. The reaction gas mixture G that has entered the two second ionizers 120n1 and 120n2 turns into a negatively-ionized reaction gas mixture G$^-$ and enters the reaction chamber 110.

The two first ionizers 120p1 and 120p2 may be connected to the reaction chamber 110 via a first conductive pipe 131p1 and a second conductive pipe 131p2, respectively. The two second ionizers 120n1 and 120n2 may be connected to the reaction chamber 110 via a third conductive pipe 131n1 and a fourth conductive pipe 131n2, respectively.

Compared with the substrate processing apparatus 100 of FIG. 1, assuming that a reaction gas mixture G is supplied at the same volumetric flow rate, because the reaction gas mixture G is branched and supplied to the four ionizers, namely, the first ionizers 120p1 and 120p2, and the second ionizers 120n1 and 120n2, the reaction gas may be more effectively ionized.

Figure 5:
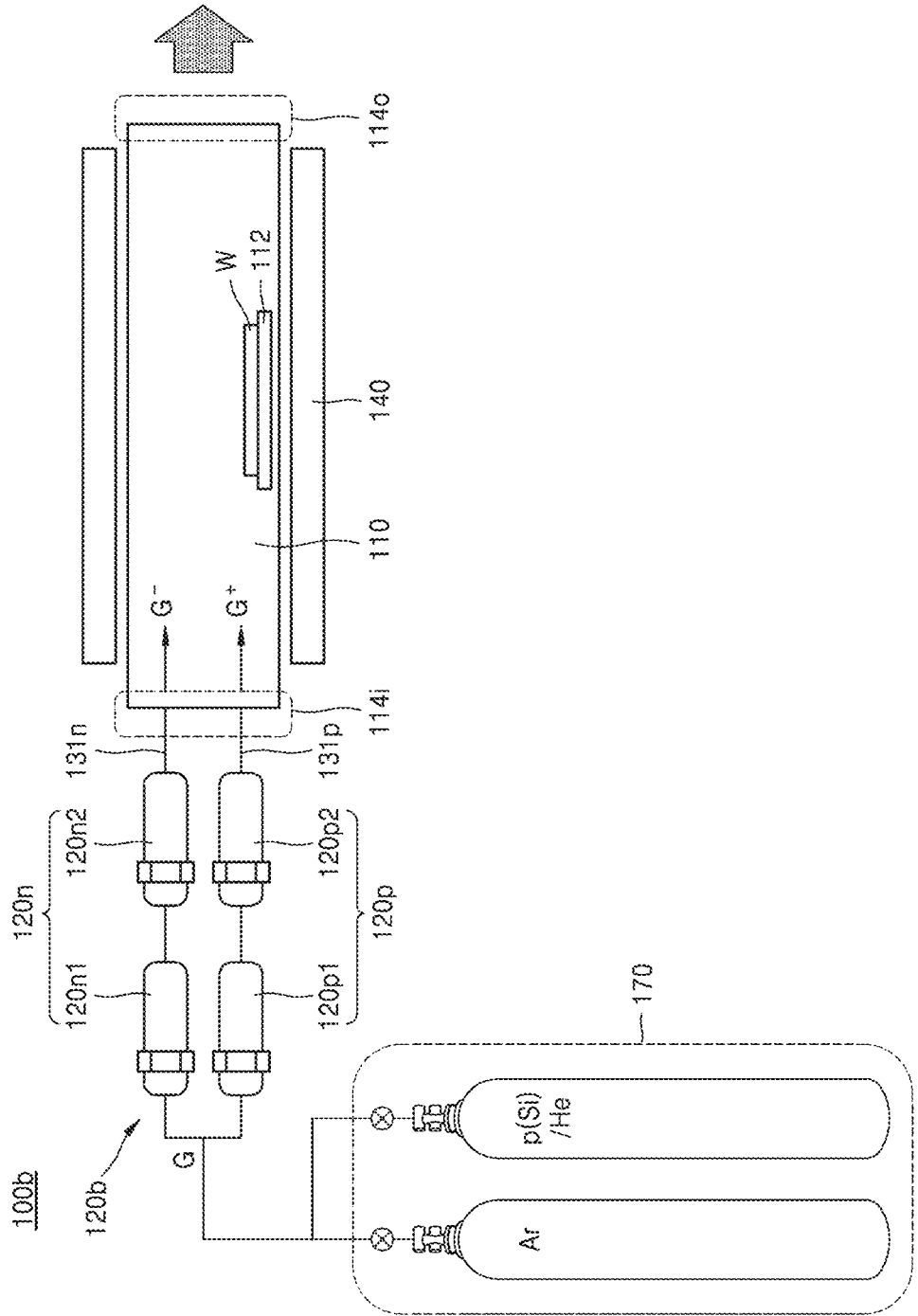
FIG. 5 is a schematic view of a substrate processing apparatus according to another embodiment of the inventive concept.

FIG. 5 is a schematic view of a substrate processing apparatus 100b according to another embodiment of the inventive concept.

The substrate processing apparatus 100b of FIG. 5 is the same as the substrate processing apparatus 100 of FIG. 1 except that more ionizers are provided than the substrate processing apparatus 100 of FIG. 1. Accordingly, this difference will now be focused on and described.

Referring to FIG. 5, two first ionizers 120p1 and 120p2 may be serially connected to the inlet 114i of the reaction chamber 110. Two second ionizers 120n1 and 120n2 may be serially connected to the inlet 114i of the reaction chamber 110. The two first ionizers 120p1 and 120p2 and the two second ionizers 120n1 and 120n2 may be connected to the inlet 114i of the reaction chamber 110 in parallel.

In detail, the reaction gas mixture G that is supplied by the gas supply system 170 is provided to each of the first ionizer 120p1 and the second ionizer 120n1, which are front ionizers. A reaction gas mixture obtained by the first ionizer 120p1 as a front ionizer partially ionizing the reaction gas mixture G may be supplied to the first ionizer 120p2, which is a rear ionizer, and further ionized and then may enter the reaction chamber 110 via the first conductive pipe 131p. A reaction gas mixture obtained by the second ionizer 120n1 as a front ionizer partially ionizing the reaction gas mixture G may be supplied to the second ionizer 120n2, which is a rear ionizer, and further ionized and then may enter the reaction chamber 110 via the second conductive pipe 131n.

Compared with the substrate processing apparatus 100 of FIG. 1, assuming that a reaction gas mixture G having the same volume flow rate is supplied, a branch of the reaction gas mixture G toward the two first ionizers 120p1 and 120p2 passes both the first ionizer 120p1 as a front ionizer and the first ionizer 120p2 as a rear ionizer, and thus, the substrate processing apparatus 100b may perform more effective ionization. This effect is equally applied to a branch of the reaction gas mixture G toward the two second ionizers 120n1 and 120n2.

A silicon precursor that may be supplied to the reaction chamber 110 to form a silicon layer may be, for example, silane ($SiH_4$), disilane ($Si_2H_6$), monofluorosilane ($SiFH_3$), difluorosilane ($SiF_2H_2$), trifluorosilane ($SiF_3H$), tetrafluorosilane ($SiF_4$), monofluorodisilane ($Si_2FH_5$), difluorodisilane ($Si_2F_2H_4$), trifluorodisilane ($Si_2F_3H_3$), tetrafluorodisilane ($Si_2F_4H_2$), pentafluorodisilane ($Si_2F_5H$), hexafluorodisilane ($Si_2F_6$), monochlorosilane ($SiClH_3$), dichlorosilane ($SiCl_2H_2$), trichlorosilane ($SiCl_3H$), etrachlorosilane ($SiCl_4$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentaclolodisilane ($Si_2Cl_5H$), hexachlorodisilane ($Si_2Cl_6$), monobromosilane ($SiBrH_3$), dibromosilane ($SiBr_2H_2$), tribromosilane ($SiBr_3H$), tetrabromosilane ($SiBr_4$), monobromodisilane ($Si_2BrH_5$), dibromodisilane ($Si_2Br_2H_4$), tribromodisilane ($Si_2Br_3H_3$), tetrabromodisilane ($Si_2Br_4H_2$), pentabromodisilane ($Si_2Br_5H$), hexabromodisilane ($Si_2Br_6$), monoiodosilane ($SiIH_3$), diiodosilane ($SiI_2H_2$), triiodosilane ($SiI_3H$), tetraiodosilane ($SiI_4$), monoiododisilane ($Si_2IH_5$), diiododisilane ($Si_2I_2H_4$), triiododisilane ($Si_2I_3H_3$), tetraiododisilane ($Si_2I_4H_2$), pentaiododisilane ($Si_2I_5H$), or hexaiododisilane ($Si_2I_6$), but embodiments of the inventive concept are not limited thereto. According to some embodiments, the silicon precursor may be diethyl silane $Et_2SiH_2$ tetraethyl orthosilicate ($Si(OCH_2CH_3)_4$, TEOS), or an alkyl amino silane-based compound, but embodiments of the inventive concept are not limited thereto. The alkyl amino silane-based compound may include, for example, diisopropylaminosilane ($H_3Si(N(i\text{-Prop})_2)$), bis (tertiary-butylamino) silane (($(C_4H_9(H)N)_2SiH_2$), tetrakis (dimethylamino) silane ($Si(NMe_2)_4$), tetrakis (ethylmethylamino) silane ($Si(NEtMe)_4$), tetrakis (diethylamino) silane ($Si(NEt_2)_4$), tris (diethylamino) silane ($HSi(NMe_2)_3$), tris (ethylmethylamino) silane ($HSi(NEtMe)_3$), tris (diethylamino) silane ($HSi(NEt_2)_3$), tris (dimethylhydrazino) silane ($HSi(N(H)NMe_2)_3$), bis (diethylamino) silane ($H_2Si(NEt_2)_2$), bis (diisopropylamino) silane ($H_2Si(N(i\text{-Prop})_2)_2$), tris (isopropylamino) silane ($HSi(N(i\text{-Prop})_2)_3$), or (diisopropylamino) silane ($H_3Si(N(i\text{-Prop})_2)$), but embodiments of the inventive concept are not limited thereto.

Herein, Me represents a methyl group, Et represents an ethyl group, and i-Prop represents an isopropyl group.

According to some embodiments, a germanium (Ge) precursor may be supplied to the reaction chamber 110 to form a material layer containing Ge. The Ge precursor may be, for example, germane ($GeH_4$), digermane ($Ge_2H_6$), monofluorogermane ($GeFH_3$), difluorogermane ($GeF_2H_2$), trifluorogermane ($GeF_3H$), tetrafluorogermane ($GeF_4$), monofluorodigermane ($Ge_2FH_5$), difluorodigermane ($Ge_2F_2H_4$), trifluorodigermane ($Ge_2F_3H_3$), tetrafluorodigermane ($Ge_2F_4H_2$), pentafluorodigermane ($Ge_2F_5H$), hexafluorodigermane ($Ge_2F_6$), monochlorogermane ($GeClH_3$), dichlorogermane ($GeCl_2H_2$), trichlorogermane ($GeCl_3H$), tetrachlorogermane ($GeCl_4$), monochlorogermane ($Ge_2ClH_5$), dichlorodigermane ($Ge_2Cl_2H_4$), trichlorodigermane ($Ge_2Cl_3H_3$), tetrachlorodigermane ($Ge_2Cl_4H_2$), pentachlorodigermane ($Ge_2Cl_5H$), hexachlorodigermane ($Ge_2Cl_6$), monobromogermane ($GeBrH_3$), dibromogermane ($GeBr_2H_2$), tribromogermane ($GeBr_3H$), tetrabromogermane ($GeBr_4$), monobromogermane ($Ge_2BrH_5$), dibromodigermane ($Ge_2Br_2H_4$), tribromodigermane ($Ge_2Br_3H_3$), tetrabromodigermane ($Ge_2Br_4H_2$), pentabromodigermane ($Ge_2Br_5H$), hexabromodigermane ($Ge_2Br_6$), monoiodogermane ($GeIH_3$), diiodogermane ($GeI_2H_2$), triiodogermaine ($GeI_3H$), tetraiodogermane ($GeI_4$), monoiododigermane ($Ge_2IH_5$), diiododigermane ($Ge_2I_2H_4$), triiododigermane ($Ge_2I_3H_3$), tetraiododigermane ($Ge_2I_4H_2$), pentaiododigermane ($Ge_2I_5H$), or hexaiododigermane ($Ge_2I_6$), but embodiments of the inventive concept are not limited thereto.

According to some embodiments, a boron (B) precursor may be supplied to the reaction chamber 110 to form a material layer containing B. The B precursor may be, for example, borane ($BH_4$), diborane ($B_2H_6$), monofluoroborane ($BFH_3$), difluoroborane ($BF_2H_2$), trifluoroborane ($BF_3H$), tetrafluoroborane ($BF_4$), monofluorodiborane ($B_2FH_5$), difluorodiborane ($B_2F_2H_4$), trifluorodiborane ($B_2F_3H_3$), tetrafluorodiborane ($B_2F_4H_2$), pentafluorodiborane ($B_2F_5H$), hexafluorodiborane ($B_2F_6$), monochloroborane ($BClH_3$), dichloroborane ($BCl_2H_2$), trichloroborane ($BCl_3H$), tetrachloroborane ($BCl_4$), monochlorodiborane ($B_2ClH_5$), dichlorodiborane ($B_2Cl_2H_4$), trichlorodiborane ($B_2Cl_3H_3$), tetrachlorodiborane ($B_2Cl_4H_2$), pentachlorodiborane ($B_2Cl_5H$), hexachlorodiborane ($B_2Cl_6$), monobromoborane ($BBrH_3$), dibromoborane ($BBr_2H_2$), tribromoborane ($BBr_3H$), tetrabromoborane ($BBr_4$), monobromodiborane ($B_2BrH_5$), dibromodiborane ($B_2Br_2H_4$), tribromodiborane ($B_2Br_3H_3$), tetrabromodiborane ($B_2Br_4H_2$), pentabromodiborane ($B_2Br_5H$), hexabromodiborane ($B_2Br_6$), monoiodoborane ($BIH_3$), diiodoborane ($BI_2H_2$), triiodoborane ($BI_3H$), tetraiodoborane ($BI_4$), monoiododiborane ($B_2IH_5$), diiododiborane ($B_2I_2H_4$), triiododiborane ($B_2I_3H_3$), tetraiododiborane ($B_2I_4H_2$), pentaiododiborane ($B_2I_5H$), hexaiododiborane ($B_2I_6$), or borazine ($B_3N_3H_6$), but embodiments of the inventive concept are not limited thereto.

According to some embodiments, a tungsten (W) precursor may be supplied to the reaction chamber 110 to form a material layer containing W. The W precursor may be, but is not limited to, $WF_6$, $W(CO)_6$, BTBMW(Bis(tert-butylimino)bis(dimethylamino)tungsten(VI)), or MDNOW (methylcyclopentadienyl-dicarbonylnitorsyl-tungsten.

According to some embodiments, a titanium (Ti) precursor may be supplied to the reaction chamber 110 to form a material layer containing Ti. The Ti precursor may be, for example, $TiCl_4$, TDMAT(tetrakis(dimethylamido)titanium (IV)), $Ti(NEt_2)_4$(TDEAT), $Ti(NMeEt)_4$ (TEMAT), $Ti(COCH_3)(\eta^5\text{-}C_5H_5)_2Cl$, $Ti(\eta^5\text{-}C_5H_5)Cl_2$, $Ti(\eta^5\text{-}C_5H_5)Cl_3$, $Ti(\eta^5\text{-}C_5H_5)_2Cl_2$, $Ti(\eta^5\text{-}C_5(CH_3)_5)Cl_3$, $Ti(CH_3)(\eta^5\text{-}C_5H_5)_2$ Cl, $Ti(\eta^5\text{-}C_9H_7)_2Cl_2$, $Ti(\eta^5\text{-}C_5(CH_3)_5)_2Cl_2$, $Ti(\eta^5\text{-}C_5(CH_3)_5)_2Cl_2$, $Ti(\eta^5\text{-}C_5H_5)_2(\mu\text{-}Cl)_2$, $Ti(\eta^5\text{-}C_5H_5)_2(CO)_2$, $Ti(CH_3)_3(\eta^5\text{-}C_5H_5)$, $Ti(CH_3)_3(\eta^5\text{-}C_5H_5)_2$, $Ti(CH_3)_4$, $Ti(\eta^5\text{-}C_5H_5)(\eta^7\text{-}C_7H_7)$, $Ti(\eta^5\text{-}C_5H_5)(\eta^8\text{-}C_8H_8)$, $Ti(C_5H_5)_2(\eta^5\text{-}C_5H_5)_2$, $Ti(\eta^5\text{-}C_5(CH_3)_5)_2$, $Ti(\eta^5\text{-}C_5(CH_3)_5)_2H_2$, or Ti $(CH_3)_2(\eta^5\text{-}C_5(CH_3)_5)_2$, but embodiments of the inventive concept are not limited thereto.

According to some embodiments, a molybdenum (Mo) precursor may be supplied to the reaction chamber 110 to form a material layer containing Mo. The Mo precursor may be, but is not limited to, $MoCl_6$, $MoCl_5$, $Mo(CO)_6$, or $MoO_xCl_y$.

According to some embodiments, an aluminum (Al) precursor may be supplied to the reaction chamber 110 to form a material layer containing Al. The Al precursor may be, but is not limited to, trimethyl aluminum (TMA), $AlEt_3$, $AlMe_2H$, $[Al(O\text{—}^sBu)_3]_4$, $Al(CH_3COCHCOCH_3)_3$, $AlCl_3$, $AlBr_3$, $AlI_3$, $Al(O\text{—}^iPr)_3$, $[Al(NMe_2)_3]_2$, $Al(^tBu)_2Cl$, $Al(^iBu)_3$, $Al(^iBu)_2H$, $AlEt_2Cl$, $Et_3Al_2(O\text{—}^sBu)_3$, or $Al(THD)_3$.

Figure 6:
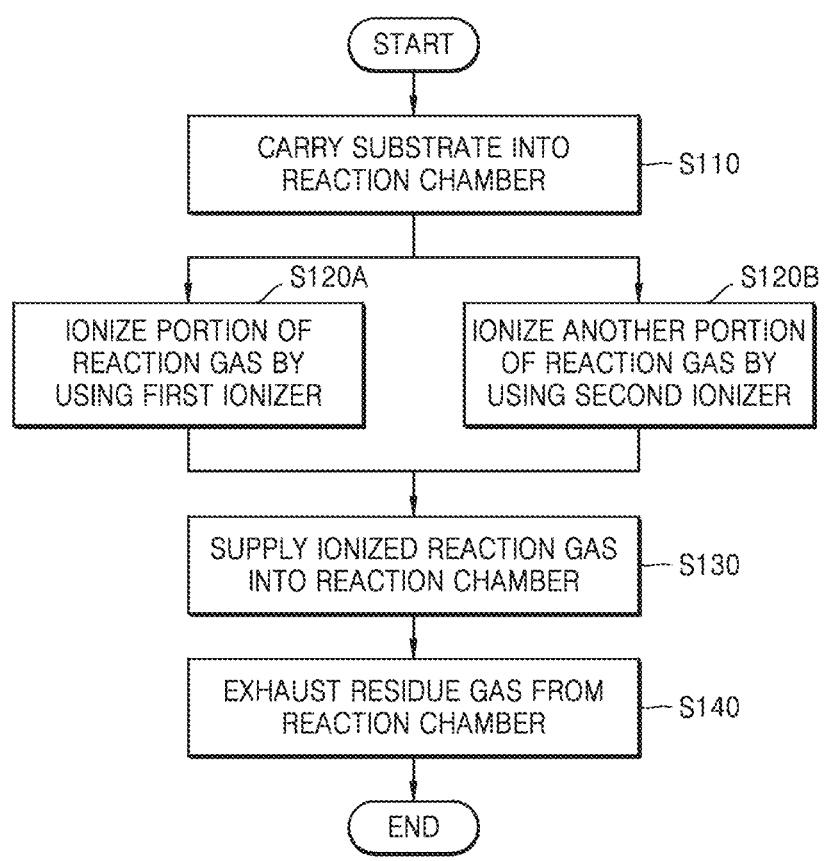
FIG. 6 is a flowchart of a method of forming a material layer, according to an embodiment of the inventive concept.

FIG. 6 is a flowchart of a method of forming a material layer, according to an embodiment of the inventive concept.

Referring to FIGS. 1 and 6, the substrate W may be carried into the reaction chamber 110, in operation S110. Although the single substrate W is carried into the reaction chamber 110 in FIG. 1, two or more substrates may be carried into the reaction chamber 110 as necessary.

Thereafter, in operation S120A, a portion of the reaction gas G may be ionized by the first ionizer 120p. In operation S120B, another portion of the reaction gas G may be ionized by the second ionizer 120n. The first ionizer 120p may ionize the reaction gas G to cations, and the second ionizer 120n may ionize the reaction gas G to anions. The ionization of the reaction gas G to cations and anions by the first ionizer 120p and the second ionizer 120n, respectively, has been described above with reference to FIGS. 1 through 4, and thus, a detailed description thereof will be omitted.

Then, the ionized reaction gas G is supplied into the reaction chamber 110, in operation S130. The ionized reaction gas G may cause a CVD reaction within the reaction chamber 110, and a metal element of the reaction gas G may be deposited on the upper surface of the substrate W at high speed.

The CVD reaction generates reaction by-products, and the reaction by-products need to be discharged from the reaction chamber 110. To this end, residue gas including the reaction by-products may be discharged from the reaction chamber 110 by a unit such as a pump, in operation S140. A portion of the supplied reaction gas G may not participate in the CVD reaction, and may be partially included in the residue gas.

The supply of the reaction gas G may continue until a material layer with a desired thickness is formed on the substrate W.

The use of substrate processing apparatuses, material layer deposition apparatuses, and AP-CVD apparatuses according to embodiments of the inventive concept enables a high-quality material layer to be quickly formed.

Although structures and effects of the inventive concept will now be described in detail with detailed embodiments and comparative examples, these embodiments are only for better understanding of the inventive concept and are not intended to limit the scope of the inventive concept.

<Ionization Performance Test>

Figure 7:
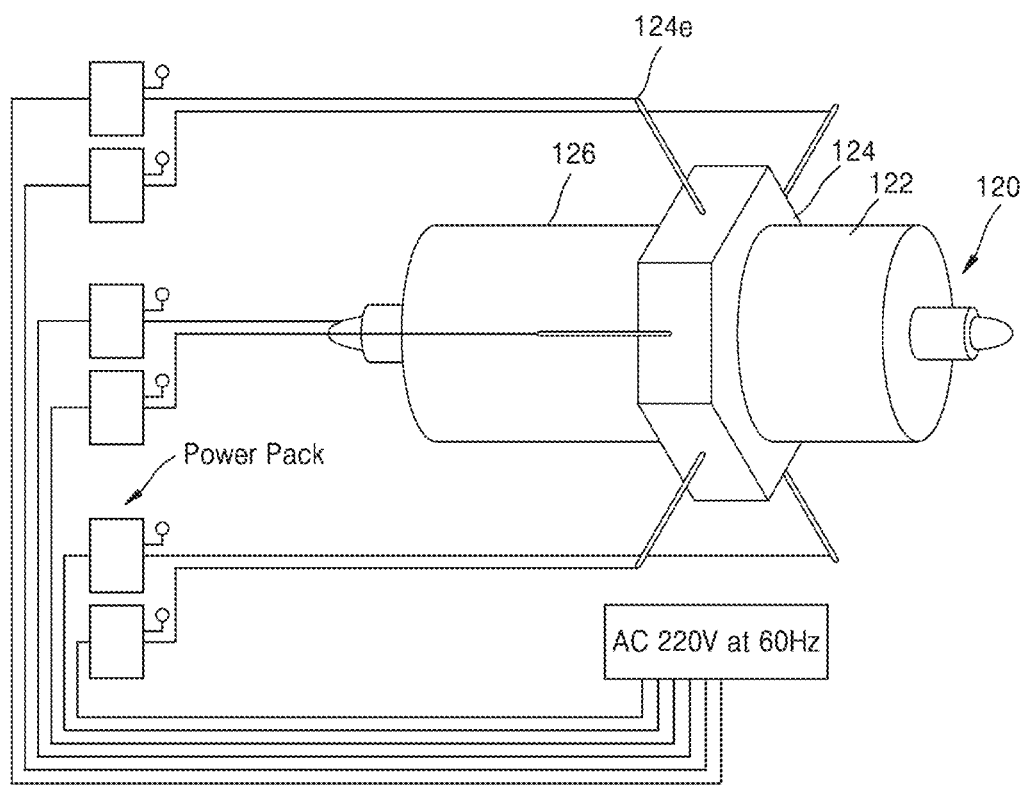
FIG. 7 is a conceptual view illustrating ionizers manufactured to perform an ionization performance test, and its surrounding components.

An ionizer was configured as shown in FIG. 7, and the performance of the ionizer to ionize gas that passes through the ionizer was measured.

Referring to FIG. 7, the electrode support 124 was formed of Teflon, and the six discharge electrodes 124e were inserted into the electrode support 124 at equal intervals. Each of the discharge electrodes 124e was manufactured by binding 300 carbon fibers each having a diameter of from about 5 μm to about 10 μm with an insulative tape. The inlet housing 122 and the outlet housing 126 were formed of stainless steel.

A power pack capable of supplying DC power of 5 kV was connected to the discharge electrode 124e, and alternating current (AC) power of 220V was supplied to the power pack.

Thereafter, the ionization degree of gas that is exhausted by the outlet housing 126 while supplying a reaction gas mixture through the inlet housing 122 was measured using a Faraday cup electrometer (FCE) and a picoammeter connected to the FCE.

A silane gas mixture of 50 sccm diluted at a 10% concentration in helium (He) gas, and argon (Ar) of 1000 sccm were used as the reaction gas mixture.

Figure 8:
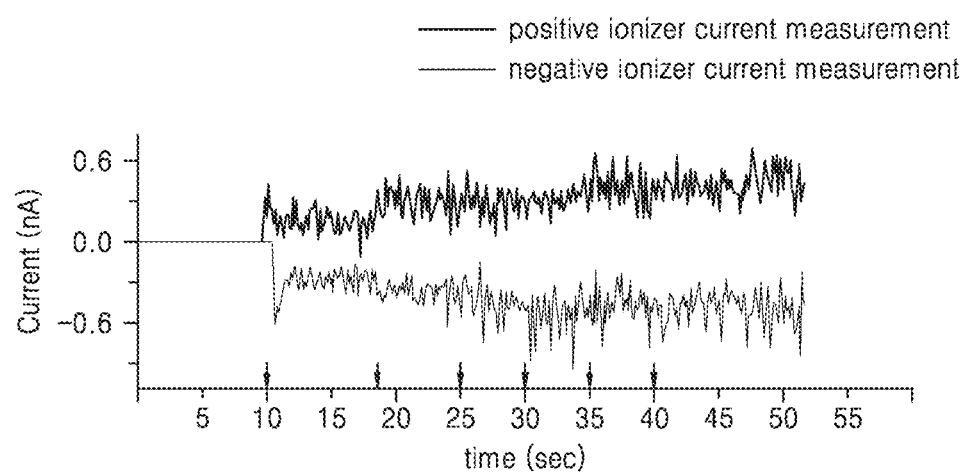
FIG. 8 is a graph showing a result of measuring an ionization degree of gas ionized by the ionizer of FIG. 7.

FIG. 8 is a graph showing a result of the measurement.

Referring to FIG. 8, first, it was observed that a neutral gas was maintained while no power is being supplied to the six discharge electrodes 124e, and thus, no current flowed to the FCE. Thereafter, the six discharge electrodes 124e were supplied with power of 5 kV one by one, and accordingly, it was observed that an ionization degree of the reaction gas mixture discharged through the outlet housing 126 increased (see the thick solid line).

The six discharge electrodes 124e were supplied with power of −5 kV one by one while maintaining flow of the reaction gas mixture, and accordingly, it was observed that the ionization degree of the reaction gas mixture discharged through the outlet housing 126 increased in a negative direction (see the thin solid line).

In particular, it is known in the past that negative charging is more difficult than positive charging due to corona discharge. However, referring to FIG. 8, it demonstrates that, because a tendency toward positive ionization (thick solid line) and a tendency toward negative ionization (thin solid line) are nearly equal to each other, effective negative ionization is possible even when corona discharge is applied.

<Silicon Layer Formation Test>

Experimental Example 1

A silicon layer was formed on a substrate by supplying a reaction gas mixture to the substrate processing apparatus 100 configured as shown in FIG. 1. A monocrystal silicon wafer having a size of 10 mm×10 mm×1 mm was used as the substrate. A silane gas mixture of 50 sccm diluted at a 10% concentration in helium (He) gas, and argon (Ar) of 1000 sccm were used as the reaction gas mixture.

The silicon layer was formed by CVD for 10 hours while the temperature of the substrate processing apparatus 100 is 450° C., power of +5 kV is being supplied to a first ionizer, and power of −5 kV is being supplied to a second ionizer. The ionizers described above with reference to FIG. 7 were used as the first and second ionizers.

Comparative Example 1

A silicon layer was formed on the substrate in the same method as Experimental example 1 except that no power is supplied to the first and second ionizers.

Figure 9:
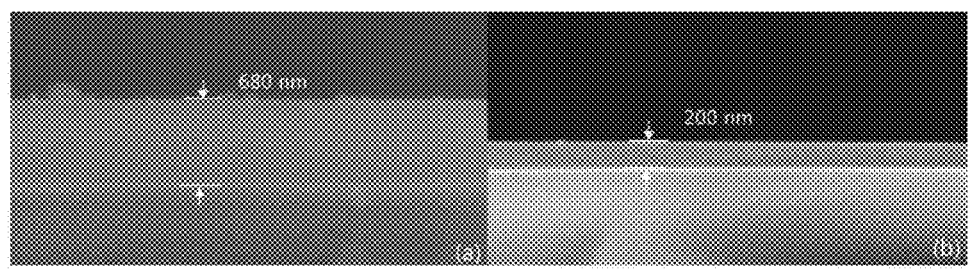
FIG. 9 is a field emission scanning electron microscope (FESEM) image that represents cross-sections of silicon layers formed in Experimental example 1 according to the inventive concept and Comparative example 1.

Cross-sections of the silicon layers formed in Experimental example 1 and Comparative example 1 were observed by a field emission scanning electron microscope (FESEM), and images of the observed cross-sections are shown in FIG. 9.

Referring to FIG. 9, the silicon layer formed by Experimental example 1 has a thickness of 680 nm (image (a)), and the silicon layer formed by Comparative example 1 has a thickness of 200 nm (image (b)). It was discovered that, when an ionizer is used, deposition may occur at a deposition rate 3.4 times that of the case when no ionizers are used during the same time period.

Experimental Example 2

A silicon layer was formed on the substrate in the same method as Experimental example 1 except that the temperature of the substrate processing apparatus 100 is 500° C. and a reaction time period is 8 hours.

Comparative Example 2

A silicon layer was formed on the substrate in the same method as Experimental example 2 except that no power is supplied to the first and second ionizers.

Figure 10:
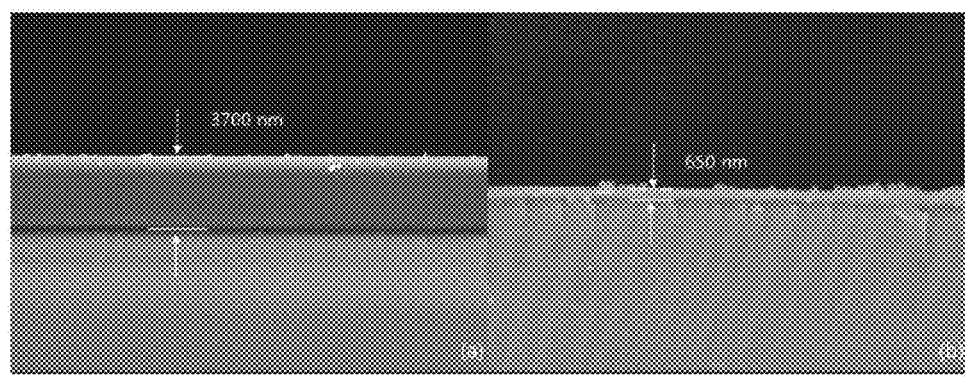
FIG. 10 is an FESEM image that represents cross-sections of silicon layers formed in Experimental example 2 according to the inventive concept and Comparative example 2.

Cross-sections of the silicon layers formed in Experimental example 2 and Comparative example 2 were observed by an FESEM, and images of the observed cross-sections are shown in FIG. 10.

Referring to FIG. 10, the silicon layer formed by Experimental example 2 has a thickness of 3700 nm (image (a)), and the silicon layer formed by Comparative example 2 has a thickness of 650 nm (image (b)). It was discovered that, when an ionizer is used, deposition may occur at a deposition rate 5.7 times that of the case when no ionizers are used during the same time period.

Experimental Example 3

A silicon layer was formed on the substrate in the same method as Experimental example 1 except that the temperature of the substrate processing apparatus 100 is 700° C. and a reaction time period is 30 minutes.

Comparative Example 3

A silicon layer was formed on the substrate in the same method as Experimental example 3 except that no power is supplied to the first and second ionizers.

Figure 11:
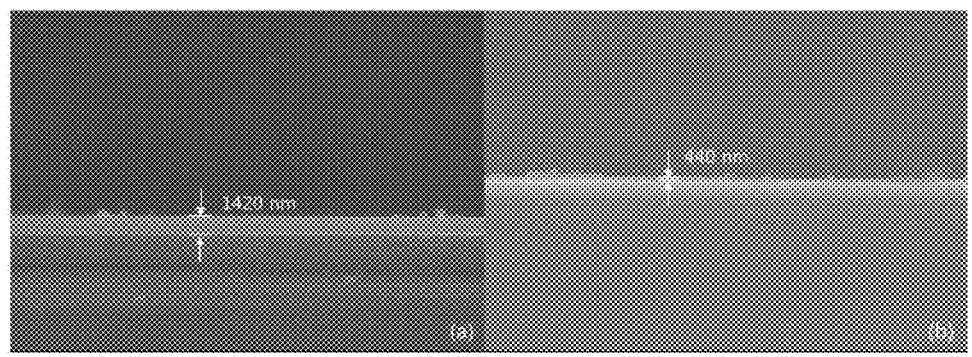
FIG. 11 is an FESEM image that represents cross-sections of silicon layers formed in Experimental example 3 according to the inventive concept and Comparative example 3.

Cross-sections of the silicon layers formed in Experimental example 3 and Comparative example 3 were observed by an FESEM, and images of the observed cross-sections are shown in FIG. 11.

Referring to FIG. 11, the silicon layer formed by Experimental example 3 has a thickness of 1420 nm (image (a)), and the silicon layer formed by Comparative example 3 has a thickness of 440 nm (image (b)). It was discovered that, when an ionizer is used, deposition may occur at a deposition rate 3.2 times that of the case when no ionizers are used during the same time period.

Experimental Example 4

A silicon layer was formed on the substrate in the same method as Experimental example 1 except that the temperature of the substrate processing apparatus 100 is 900° C. and a reaction time period is 30 minutes.

Comparative Example 4

A silicon layer was formed on the substrate in the same method as Experimental example 4 except that no power is supplied to the first and second ionizers.

Figure 12:
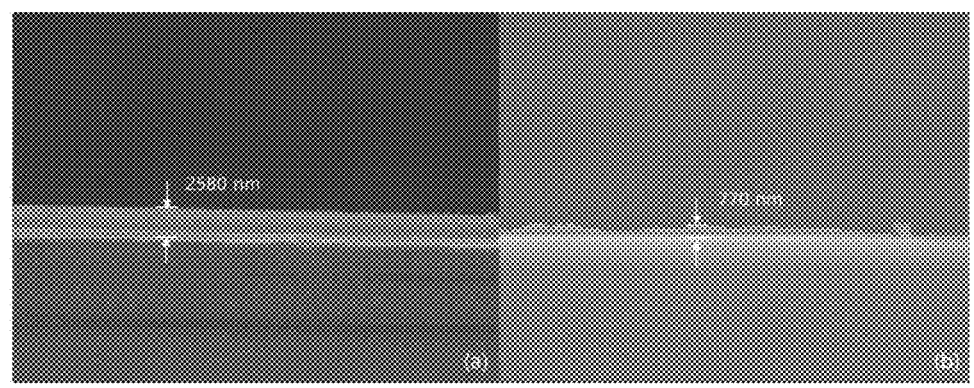
FIG. 12 is an FESEM image that represents cross-sections of silicon layers formed in Experimental example 4 according to the inventive concept and Comparative example 4.

Cross-sections of the silicon layers formed in Experimental example 4 and Comparative example 4 were observed by an FESEM, and images of the observed cross-sections are shown in FIG. 12.

Referring to FIG. 12, the silicon layer formed by Experimental example 4 has a thickness of 2580 nm (image (a)), and the silicon layer formed by Comparative example 4 has a thickness of 770 nm (image (b)). It was discovered that, when an ionizer is used, deposition may occur at a deposition rate 3.4 times that of the case when no ionizers are used during the same time period.

Experimental Example 5

A silicon layer was formed on the substrate in the same method as Experimental example 1 except that the temperature of the substrate processing apparatus 100 is 1100° C. and a reaction time period is 30 minutes.

Comparative Example 5

A silicon layer was formed on the substrate in the same method as Experimental example 5 except that no power is supplied to the first and second ionizers.

Figure 13:
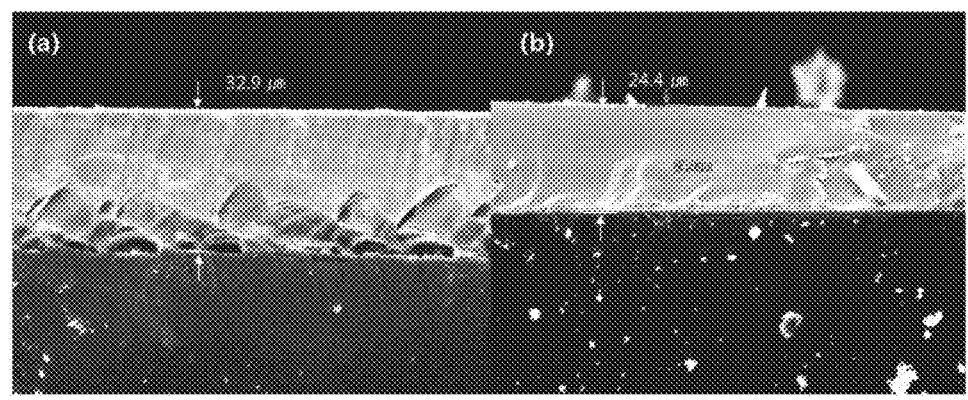
FIG. 13 is an FESEM image that represents cross-sections of silicon layers formed in Experimental example 5 according to the inventive concept and Comparative example 5.

Cross-sections of the silicon layers formed in Experimental example 5 and Comparative example 5 were observed by an FESEM, and images of the observed cross-sections are shown in FIG. 13.

Referring to FIG. 13, the silicon layer formed by Experimental example 5 has a thickness of 32.9 micrometers (μm) (image (a)), and the silicon layer formed by Comparative example 5 has a thickness of 24.4 μm (image (b)). It was discovered that, when an ionizer is used, deposition may occur at a deposition rate 1.3 times that of the case when no ionizers are used during the same time period.

The above-described experiment results of Experimental examples 1 through 5 and Comparative examples 1 through 5 are summarized as follows.

TABLE 1

| Experiment ID | Reaction temperature (° C.) | Reaction duration | Deposition thickness (experimental example)(A) | Deposition thickness (comparative example)(B) | A/B |
|---|---|---|---|---|---|
| 1 | 450 | 10 hours | 680 nm | 200 nm | 3.4 |
| 2 | 500 | 8 hours | 3700 nm | 650 nm | 5.7 |
| 3 | 700 | 30 minutes | 1420 nm | 440 nm | 3.2 |
| 4 | 900 | 30 minutes | 2580 nm | 770 nm | 3.4 |
| 5 | 1100 | 30 minutes | 32.9 μm | 24.4 μm | 1.3 |

As shown in Table 1, a difference between deposition speeds of an experimental example and a comparative example may be maximum at a reaction temperature of about 500° C.

<Crystallinity Test>

Figure 14:
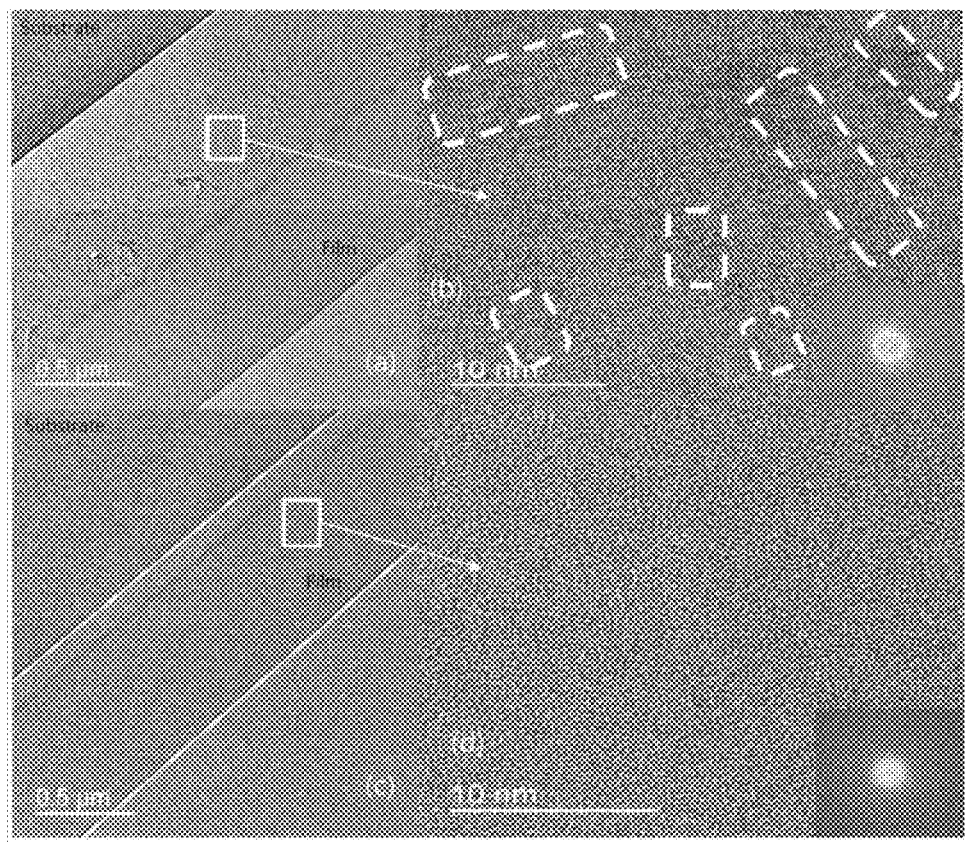
FIG. 14 is a transmission electron microscope (TEM) image of free surfaces of the silicon layers formed in Experimental example 4 according to the inventive concept and Comparative example 4.

Surface images of free surfaces of the silicon layers formed in Experimental example 4 and Comparative example 4 were obtained by a transmission electron microscope (TEM), and are shown in FIG. 14.

The surface images in (a) and (c) of FIG. 14 are low-resolution TEM images obtained from the free surfaces of the silicon layers formed in Experimental example 4 and Comparative example 4, and the surface images in (b) and (d) of FIG. 14 are high-resolution TEM images obtained from the rectangular portions in (a) and (c) of FIG. 14.

First, referring to the image of (d), an amorphous silicon layer was formed on the entire surface of the substrate.

Referring to the image of (b), nano-crystalline silicon was performed over almost the entire area, and amorphous silicon was formed between these nano-crystalline grains. In particular, it may be relatively clearly observed from rectangular portions indicated by dashed lines that a formed silicon layer has a crystalline structure.

Accordingly, when a positive ionizer and a negative ionizer according to embodiments of the inventive concept are used, a quality material layer may also be obtained in a crystallographic respect.

<Single Ionizer Test>

Comparative Example 6

A silicon layer was formed in the same method as Experimental example 4 except that the second ionizer is not driven. In other words, only the first ionizer was driven, and accordingly, the reaction gas mixture was ionized only positively.

Comparative Example 7

A silicon layer was formed in the same method as Experimental example 4 except that the first ionizer is not driven. In other words, only the second ionizer was driven, and accordingly, the reaction gas mixture was ionized only negatively.

Figure 15:
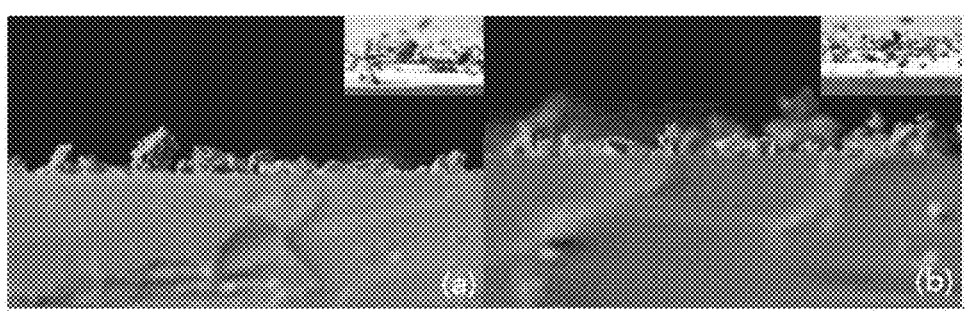
FIG. 15 is an FESEM image that represents cross-sections of the silicon layers formed in Comparative examples 6 and 7.

A cross-section of the silicon layer formed in Comparative example 6 (image (a)) and a cross-section of the silicon layer formed in Comparative example 7 were observed by an FESEM, and images of the observed cross-sections are shown in FIG. 15.

Compared with the images of FIGS. 9 through 13, the silicon layers shown in the images of FIG. 15 have irregular three-dimensional structures on their surfaces. The irregular three-dimensional structures of FIG. 15 show inferior surface morphology compared with the surfaces of Experimental examples 1 through 5 of FIGS. 9 through 13 and even the surfaces of Comparative examples 1 through 5. Embodiments of the inventive concept are not limited to a particular theory, and the surface morphology of FIG. 15 is due to an electrostatic interaction resulting from the reaction gas charged to a single polarity.

While the inventive concept has been particularly shown and described with reference to embodiments thereof, it will be understood that various changes in form and details may be made therein without departing from the scope of the following claims.

What is claimed is:

1. A substrate processing apparatus, comprising:
   a reaction chamber including an inlet through which a reaction gas is supplied, and an outlet through which residue gas is exhausted;
   a plurality of ionizers located at a front end of the inlet and configured to ionize the reaction gas supplied through the inlet; and
   a heater configured to heat the reaction chamber,
   wherein the plurality of ionizers comprise:
      a first ionizer configured to ionize the reaction gas positively; and
      a second ionizer configured to ionize the reaction gas negatively,
      wherein each of the first ionizer and the second ionizer comprises an inlet housing having an inlet port, an electrode support, and an outlet housing portion having an outlet port,
      wherein the inlet housing, the electrode support, and the outlet housing define an internal space having a longitudinal centerline extending from the inlet port to the outlet port, and
      wherein the electrode support comprises an annular inner wall, wherein the electrode support is configured to support a plurality of discharge electrodes such that the discharge electrodes are circumferentially spaced apart and extend axially through the electrode support inner wall so that a terminal end of each discharge electrode is within the internal space and oriented toward the longitudinal centerline of the internal space.

2. The substrate processing apparatus of claim 1, wherein the first ionizer and the second ionizer are connected to the inlet of the reaction chamber in parallel.

3. The substrate processing apparatus of claim 1, wherein at least one of the first ionizer and the second ionizer is configured to ionize the reaction gas responsive to corona discharge.

4. The substrate processing apparatus of claim 1,
   wherein, along a direction of gas flow, an entire length of the outlet portion is greater than an entire length of the inlet portion.

5. The substrate processing apparatus of claim 4, wherein an inner wall of the outlet portion has a frustoconical shape with an inner diameter that linearly decreases in a direction away from the discharge portion.

6. The substrate processing apparatus of claim 1, wherein each discharge electrode comprises a bundle of carbon fibers, and wherein terminal ends of the carbon fibers in the bundle of carbon fibers are randomly spaced apart from each other within the internal space.

7. The substrate processing apparatus of claim 4, wherein the inlet housing and the outlet housing comprise electrical conductors and are grounded.

8. The substrate processing apparatus of claim 1, wherein the first ionizer comprises a plurality of first ionizers, and wherein the second ionizer comprises a plurality of second ionizers.

9. The substrate processing apparatus of claim 8, wherein the plurality of first ionizers and the plurality of second ionizers are connected to the inlet of the reaction chamber in parallel.

10. The substrate processing apparatus of claim 8, wherein the plurality of first ionizers are serially connected to each other,
   wherein the plurality of second ionizers are serially connected to each other, and
   wherein the plurality of first ionizers serially connected to each other and the plurality of second ionizers serially connected to each other are connected to the inlet of the reaction chamber in parallel.

11. A material layer deposition apparatus, comprising:
   a deposition chamber including an inlet through which a deposition gas is supplied and an outlet through which residue gas is exhausted, wherein the deposition chamber is configured to accommodate a substrate on which a material layer is to be formed;
   a first ionizer located at a front end of the inlet and configured to positively ionize the deposition gas supplied through the inlet;
   a second ionizer located at the front end of the inlet and configured to negatively ionize the deposition gas supplied through the inlet;
   a first power device configured to supply positive direct current power to the first ionizer; and
   a second power device configured to supply negative direct current power to the second ionizer,
   wherein each of the first ionizer and the second ionizer comprises an inlet housing having an inlet port, an electrode support, and an outlet housing having an outlet port, wherein the inlet housing, the electrode support, and the outlet housing define an internal space having a longitudinal centerline extending from the inlet port to the outlet port, and wherein the electrode support comprises an annular inner wall, wherein the electrode support is configured to support a plurality of discharge electrodes such that the discharge electrodes are circumferentially spaced apart and extend axially through the electrode support inner wall so that a terminal end of each discharge electrode is within the internal space and oriented toward the longitudinal centerline of the internal space.

12. The material layer deposition apparatus of claim 11, wherein an internal pressure of the deposition chamber when the material layer is formed has an absolute pressure of from 0.5 atmospheres to 1.5 atmospheres.

13. The material layer deposition apparatus of claim 11, further comprising a heater configured to heat the deposition chamber,
wherein the heater is configured to heat the deposition chamber when the material layer is formed to an internal temperature of from 480° C. to 600° C.

14. The material layer deposition apparatus of claim 13, wherein a deposition speed of the material layer is from 3 nm/minutes to 10 nm/minutes at a temperature of 500° C. or from 20 nm/minutes to 70 nm/minutes at a temperature of 700° C.

15. The material layer deposition apparatus of claim 12, wherein the material layer comprises a silicon layer, and
wherein the deposition gas comprises at least one compound selected from the group consisting of silane ($SiH_4$), disilane ($Si_2H_6$), monofluorosilane ($SiFH_3$), difluorosilane ($SiF_2H_2$), trifluorosilane ($SiF_3H$), tetrafluorosilane ($SiF_4$), monofluorodisilane ($Si_2FH_5$), difluorodisilane ($Si_2F_2H_4$), trifluorodisilane ($Si_2F_3H_3$), tetrafluorodisilane ($Si_2F_4H_2$), pentafluorodisilane ($Si_2F_5H$), hexafluorodisilane ($Si_2F_6$), monochlorosilane ($SiClH_3$), dichlorosilane ($SiCl_2H_2$), trichlorosilane ($SiCl_3H$), etrachlorosilane ($SiCl_4$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentaclolodisilane ($Si_2Cl_5H$), hexachlorodisilane ($Si_2Cl_6$), monobromosilane ($SiBrH_3$), dibromosilane ($SiBr_2H_2$), tribromosilane ($SiBr_3H$), tetrabromosilane ($SiBr_4$), monobromodisilane ($Si_2BrH_5$), dibromodisilane ($Si_2Br_2H_4$), tribromodisilane ($Si_2Br_3H_3$), tetrabromodisilane ($Si_2Br_4H_2$), pentabromodisilane ($Si_2Br_5H$), hexabromodisilane ($Si_2Br_6$), monoiodosilane ($SiIH_3$), diiodosilane ($SiI_2H_2$), triiodosilane ($SiI_3H$), tetraiodosilane ($SiI_4$), monoiododisilane ($Si_2IH_5$), diiododisilane ($Si_2I_2H_4$), triiododisilane ($Si_2I_3H_3$), tetraiododisilane ($Si_2I_4H_2$), pentaiododisilane ($Si_2I_5H$), hexaiododisilane ($Si_2I_6$), diethyl silane $Et_2SiH_2$tetraethyl orthosilicate ($Si(OCH_2CH_3)_4$, TEOS), and an alkyl amino silane-based compound.

16. The material layer deposition apparatus of claim 12, wherein the deposition gas comprises silane ($SiH_4$), disilane ($Si_2H_6$), $WF_6$, $W(CO)_6$, BTBMW (Bis(tert-butylimino)bis(dimethylamino)tungsten(VI)), $TiCl_4$, TDMAT (tetrakis(dimethylamido)titanium(IV)), $MoCl_6$, $MoCl_5$, $Mo(CO)_6$, $MoO_xCl_y$, or trimethyl aluminum, (TMA).

17. A chemical vapor deposition apparatus comprising:
a reaction chamber comprising an inlet through which a deposition gas is supplied and an outlet through which residue gas is exhausted, wherein an internal pressure of the reaction chamber is maintained at an absolute pressure of from 0.5 atmospheres to 1.5 atmospheres;
a heater configured to heat the reaction chamber;
one or more first ionizers located at a front end of the inlet and configured to positively ionize the deposition gas supplied through the inlet;
one or more second ionizers located at the front end of the inlet and configured to negatively ionize the deposition gas supplied through the inlet;
a first power device configured to supply positive direct current power to the one or more first ionizers;
a second power device configured to supply negative direct current power to the one or more second ionizers; and
a gas supply system configured to supply a precursor gas and a carrier gas to the one or more first ionizers and the one or more second ionizers,
wherein each of the one or more first ionizers and the one or more second ionizers comprises an inlet housing through which a supplied gas enters, a discharge portion that performs discharge to ionize the supplied gas, and an outlet housing through which an ionized gas is exhausted, and
wherein the discharge portion comprises an electrode support having an annular inner wall, wherein the electrode support is configured to support a plurality of discharge electrodes such that the discharge electrodes are circumferentially spaced apart and extend axially through the electrode support inner wall so that a terminal end of each discharge electrode is within the internal space and oriented toward a center of the discharge portion.

18. The chemical vapor deposition apparatus of claim 17, wherein gas exhausted through the outlet housing of the one or more first ionizers enters the reaction chamber through a first inlet, and
wherein gas exhausted through the outlet housing of the one or more second ionizers enters the deposition chamber through a second inlet.

* * * * *